(12) United States Patent
Sipilä

(10) Patent No.: US 9,697,922 B2
(45) Date of Patent: Jul. 4, 2017

(54) RADIATION WINDOW WITH GOOD STRENGTH PROPERTIES, AND METHOD FOR ITS MANUFACTURING

(75) Inventor: Heikki Johannes Sipilä, Espoo (FI)

(73) Assignee: HS Foils Oy, Espoo (FI)

( * ) Notice: Subject to any disclaimer, the term of this patent is extended or adjusted under 35 U.S.C. 154(b) by 434 days.

(21) Appl. No.: 13/700,835

(22) PCT Filed: Feb. 4, 2011

(86) PCT No.: PCT/FI2011/050100
§ 371 (c)(1),
(2), (4) Date: Nov. 29, 2012

(87) PCT Pub. No.: WO2011/151506
PCT Pub. Date: Dec. 8, 2011

(65) Prior Publication Data
US 2013/0089184 A1   Apr. 11, 2013

(30) Foreign Application Priority Data

Jun. 3, 2010   (FI) ...................................... 20105626
Oct. 8, 2010   (WO) .................. PCT/FI2010/050781

(51) Int. Cl.
*G21K 1/00* (2006.01)
*G21K 1/02* (2006.01)
*H01J 5/18* (2006.01)
*H01L 31/028* (2006.01)

(52) U.S. Cl.
CPC ................. *G21K 1/00* (2013.01); *G21K 1/02* (2013.01); *H01J 5/18* (2013.01); *H01L 31/028* (2013.01); *H01J 2235/183* (2013.01); *H01J 2235/186* (2013.01)

(58) Field of Classification Search
CPC ...... H01J 33/04; H01J 2235/183; H01J 35/18; H01J 47/004; H01J 5/18; G03F 7/09
USPC .................... 378/161; 428/131, 337; 359/894
See application file for complete search history.

(56) References Cited

U.S. PATENT DOCUMENTS

| | | | |
|---|---|---|---|
| 4,960,486 A | 10/1990 | Perkins | |
| 5,039,203 A | 8/1991 | Nishikawa | |
| 5,173,612 A * | 12/1992 | Imai et al. | ..................... 378/161 |
| 5,578,360 A | 11/1996 | Viitanen | |
| 6,002,202 A | 12/1999 | Meyer et al. | |
| 6,740,874 B2 | 5/2004 | Doring | |
| 6,803,570 B1 * | 10/2004 | Bryson, III et al. | .......... 250/305 |
| 7,618,906 B2 * | 11/2009 | Meilahti | ....................... 378/140 |
| 2004/0251431 A1 * | 12/2004 | Yamaguchi | ............. H01J 33/04 |
| | | | 250/492.3 |

(Continued)

FOREIGN PATENT DOCUMENTS

| | | |
|---|---|---|
| DE | 101 20 335 A1 | 10/2002 |
| EP | 1788605 | 5/2007 |

(Continued)

*Primary Examiner* — Brooke Purinton
(74) *Attorney, Agent, or Firm* — Wood, Phillips, Katz, Clark & Mortimer

(57) ABSTRACT

A radiation window foil for an X-ray radiation window comprises a mesh that defines a number of openings (902), said mesh having a first side surface (903) and a second side surface (904). A layer (906) spans said openings. Said layer (906) is on the first side of the mesh but spans said openings at a level closer to the second side surface (904) of the mesh than the first side surface (903) of the mesh.

4 Claims, 8 Drawing Sheets

(56) References Cited

U.S. PATENT DOCUMENTS

| | | |
|---|---|---|
| 2008/0286660 A1* | 11/2008 | Petrarca et al. .................. 430/5 |
| 2008/0296518 A1 | 12/2008 | Xu et al. |
| 2008/0317203 A1 | 12/2008 | Ferrand et al. |
| 2008/0317209 A1* | 12/2008 | Sipila et al. .................. 378/140 |
| 2009/0173897 A1 | 7/2009 | Decker et al. |
| 2012/0087476 A1* | 4/2012 | Liddiard et al. .............. 378/140 |
| 2013/0315380 A1* | 11/2013 | Davis et al. .................. 378/161 |

FOREIGN PATENT DOCUMENTS

| | | |
|---|---|---|
| JP | 3053200 | 7/1989 |
| JP | 6289145 | 10/1994 |

* cited by examiner

FROM PREPARATION OF CARRIER

TO CUTTING INTO SIZE

FROM CUTTING INTO SIZE

TO REMOVING OF CARRIER

FROM REMOVING OF CARRIER

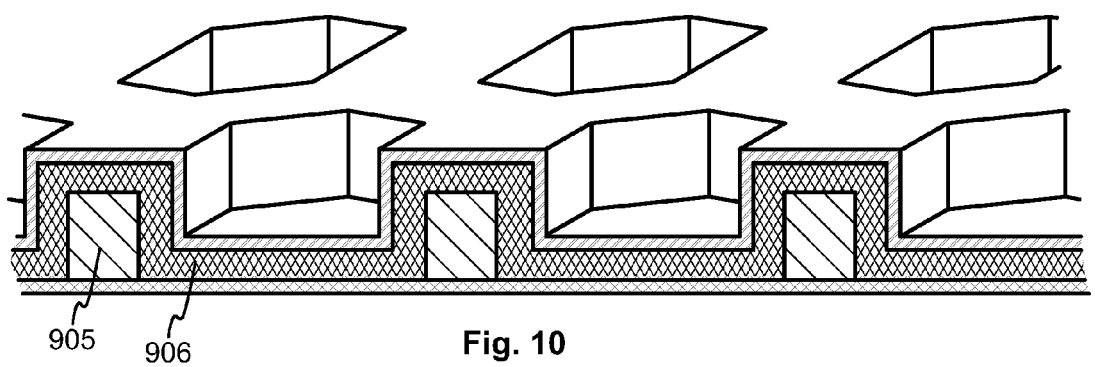
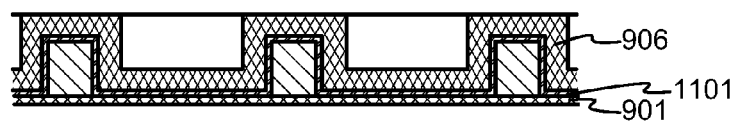
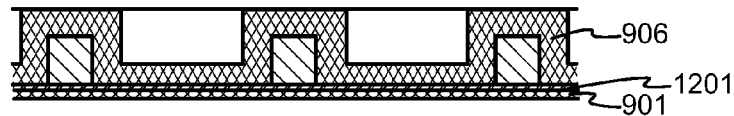
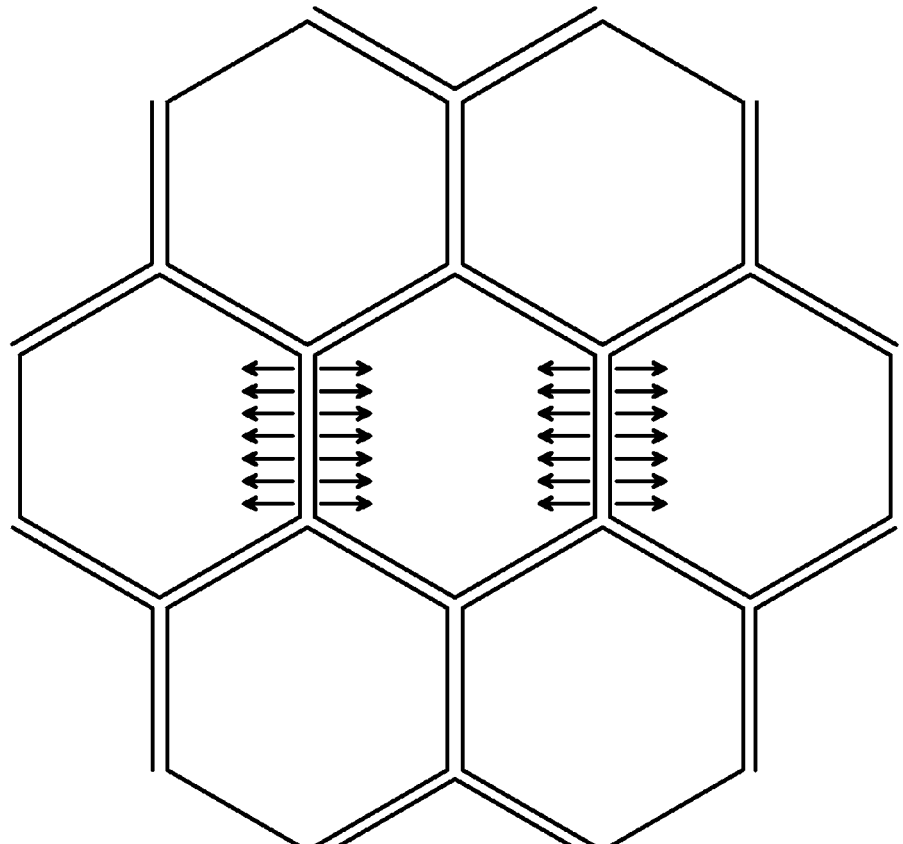
Fig. 10
Fig. 11
Fig. 12
Fig. 13

RADIATION WINDOW WITH GOOD STRENGTH PROPERTIES, AND METHOD FOR ITS MANUFACTURING

TECHNICAL FIELD

The invention concerns generally the technology of thin foils that are used as such or as a part of a radiation window in a measurement apparatus. Especially the invention concerns a method for manufacturing a very thin window foil, which can be based on beryllium or some other advantageous material, and a window foil manufactured with such method.

BACKGROUND OF THE INVENTION

A radiation window is a part of a measurement apparatus that allows a desired part of electromagnetic radiation to pass through. In many cases the radiation window must nevertheless be gastight, in order to seal and protect an enclosure where reduced pressure and/or a particular gas contents prevail. The pressure inside the enclosure may be also higher than outside, for example in measurement apparata on board space-going platforms. In order to cause as little absorption as possible of the desired radiation, a major part of the radiation window should consist of a very thin foil.

Beryllium is known as a very good material for radiation window foils especially in X-ray measurement apparata, because it has a low atomic number (4) and consequently exhibits very low absorption of X-rays. Another characteristic of beryllium that makes it very useful for radiation window foils is its exceptional flexural rigidity. The thinnest beryllium foils that are commercially available for use in radiation windows at the time of writing this description have a thickness in the order of 8 micrometres. According to prior art, the beryllium foil is manufactured from an ingot by rolling. Various coatings can be applied to the beryllium foil for example to enhance its gastightness and corrosion resistance as well as to keep undesired parts of the electromagnetic spectrum (such as visible light) from passing through the foil. An example of known radiation window foils is the DuraBeryllium foil available from Moxtek Inc., Orem, Utah, USA. It comprises an 8 micrometres thick beryllium foil coated with a DuraCoat coating. DuraBeryllium, DuraCoat, and Moxtek are registered trademarks of Moxtek Incorporated.

At the time of writing this description it appears that the rolling technology has met its limits in the sense that it has not been shown capable of manufacturing beryllium foils thinner than 8 micrometres so that they would still be sufficiently gastight. This phenomenon is associated with the relatively large grain size (larger than foil thickness), which results from the grain structure of the original beryllium ingot. Grain boundaries in the beryllium foil tend to cause gas leaks through the foil.

A feature of beryllium as a material that presents technical challenges is its toxicity, especially by inhalation of beryllium-containing dust. It would be advantageous if the manufacturing method and the structure of a thin radiation window would allow using also other materials in place of beryllium.

From prior art it is also known to utilise a support grid as a mechanical reinforcement of a radiation window foil. Prior art documents that discuss various aspects of support grids are at least US 2008/0296518 A1 and US 2009/0173897 A1.

SUMMARY OF THE INVENTION

An objective of the present invention is to produce a beryllium-or other base material based radiation window foil that causes less absorption of X-rays than the beryllium-based radiation window foils known at the time of writing this description. Another objective of the invention is to produce a gastight thin radiation window foil with good strength properties. Yet another objective of the invention is to produce a very thin window foil that can be attached to a support structure of the radiation window without sacrificing the evenness of the foil. Yet another objective of the invention is to present a method for manufacturing a radiation window foil that fulfils the objectives mentioned above.

The objectives of the invention are achieved by using an etchable carrier, covering a surface of the etchable carrier with an etch stop layer, and by forming structural material layers of the window foil on top of said etch stop layer. The beryllium or other structural material layer can be patterned, for example to make it appear as a mesh. Other layers can be added for example to act as diffusion barriers and/or to reduce the transmission of visible light. The completed stack of layers can be attached to a support structure, after which the etchable carrier can be etched away to leave only a foil comprising the structural material, etch stop, and possible other layers.

A method according to the invention is characterised by the features of the characterising part of the independent claim directed to a method.

The invention applies also to a radiation window, the characteristic features of which are described in the characterising part of the respective independent claim.

According to an aspect of the invention, there is used a temporary carrier that should fulfil two criteria: it must be possible to polish a surface of the carrier very even, and the carrier must be etchable. Among possible materials for the carrier are silicon and other semiconductor substrates, which are readily available and routinely handled in sufficient quantities and degrees of surface evenness in the integrated circuit industry. Certain metals and other solid materials, such as copper and glass, are also possible. On a polished surface of the carrier, an etch stop layer is formed, and (either directly or indirectly) on top of the etch stop layer there is formed a structural layer of beryllium or other suitable material using a thin film deposition technique that allows growing the structural layer to the desired thickness.

If the etch stop layer is uniform enough, it can alone constitute the basic continuous layer of the radiation window foil. Consequently the beryllium or other material of the so-called structural layer does not need to be continuous, but it can be made to appear as a mesh, for example by first producing a continuous layer with a thin film deposition technique and thereafter etching openings to it. As an alternative, an etch stop layer can be used that exhibits only just enough thickness and uniformity to fulfil its task as an etch stopper, leaving other tasks such as mechanical strength to other layers in the radiation window foil.

The carrier allows handling the thin layers of the manufactured radiation window foil with relative ease. The combination is attached to a region around an opening in a support structure with said structural layer facing said support structure. When the attachment is ready, the carrier is etched away, so that the layered radiation window foil remains and covers the opening in the support structure.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

The exemplary embodiments of the invention presented in this patent application are not to be interpreted to pose limitations to the applicability of the appended claims. The verb "to comprise" is used in this patent application as an open limitation that does not exclude the existence of also unrecited features. The features recited in depending claims are mutually freely combinable unless otherwise explicitly stated.

BRIEF DESCRIPTION OF DRAWINGS

FIG. 10 illustrates a radiation window foil according to an embodiment of the invention, FIG. 11 illustrates a radiation window foil according to yet another embodiment of the invention, FIG. 12 illustrates a radiation window foil according to yet another embodiment of the invention, and FIG. 13 illustrates the decoupling of loads in a radiation window foil according to an embodiment of the invention.

DETAILED DESCRIPTION OF THE
INVENTION AND ITS EMBODIMENTS

In this description we use the following vocabulary. A layer means a quantity of essentially homogeneous material that by its form has much larger dimensions in two mutually orthogonal directions than in the third orthogonal direction. In most cases of interest to the present invention, the dimension of a layer in said third orthogonal direction (also referred to as the thickness of the layer) should be constant, meaning that the layer has uniform thickness. A foil is a structure, the form of which may be characterised in the same way as that of a layer (i.e. much larger dimensions in two mutually orthogonal directions than in the third orthogonal direction) but which is not necessarily homogeneous: for example, a foil may consist of two or more layers placed and/or attached together. A mesh is a special case of a layer or foil, in which the constituents do not make up a continuous piece of material but define an array of (typically regular, and regularly spaced) openings. A radiation window foil is a foil that has suitable characteristics (low absorption, sufficient gastightness, sufficient mechanical strength etc.) for use in a radiation window of a measurement apparatus. A radiation window is an entity the comprises a piece of radiation window foil attached to a (typically annular) support structure so that electromagnetic radiation may pass through an opening defined by the support structure without having to penetrate anything else than said piece of radiation window foil and the (typically gaseous) medium that otherwise exists within said opening.

Figure 1:
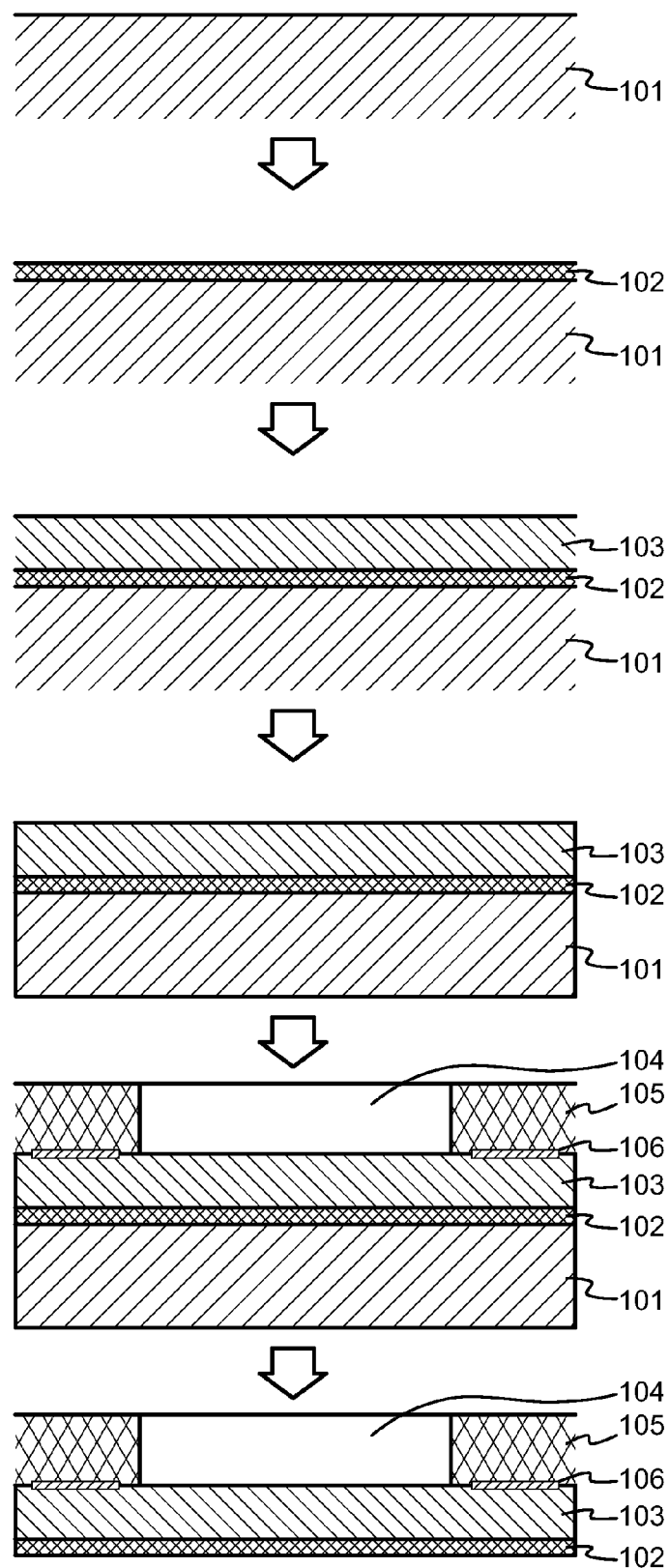
FIG. 1 illustrates a method and a radiation window according to an embodiment of the invention.

FIG. 1 illustrates a workpiece in various steps of a method for manufacturing a radiation window according to an embodiment of the invention. The topmost step illustrates a carrier 101, at least one surface of which has been polished. In FIG. 1, the polished surface faces upwards. The required smoothness of the polished surface is determined by the aim of covering it with an essentially continuous etch stop layer with uniform thickness in the order of 10 to 1000 nanometres. As an example, silicon wafers are routinely polished to achieve rms (root mean square) roughness values in the order of fractions of a nanometre, which is a sufficient for the purposes of the present invention. In addition or as alternative to silicon, the carrier 101 may be manufactured from some other solid material that is etchable with some reasonably common and easily handled etching agent and that can be polished to the required level of smoothness.

In the next step an etch stop layer 102 is produced on the polished surface of the carrier 101. The main objective of the etch stop layer 102 is to keep an etching agent, which in a later process step will appear from below and remove the carrier 101, from affecting those layers that will come on top of the etch stop layer 102. Therefore the material for the etch stop layer 102 should be selected so that it will not be affected to any significant degree by an etching agent that works effectively on the material of the carrier 101. Additionally the material of the etch stop layer 102 should be applicable for deposition in thin layers (in the order of 10 to 200 nanometres), and it should neither significantly absorb radiation nor produce any awkwardly handled anomalies at the wavelengths of electromagnetic radiation at which the radiation window is to be used. Further advantageous characteristics of an etch stop layer include corrosion resistance against environmental conditions during the use of an X-ray measurement apparatus, and good adhesion properties for further layers to be deposited thereon. If the carrier 101 is made of silicon, one advantageous material for the etch stop layer 102 is silicon nitride. As an alternative, if the carrier 101 is made of e.g. some metal that will be etched with an acid, an advantageous material for the etch stop layer 102 is titanium oxide which is known to have good resistance against may acids that eat their way through metals and metallic alloys.

The deposition of the etch stop layer 102 should take place as uniformly as possible, especially avoiding any remaining pinholes in the etch stop layer. Suitable methods for depositing the etch stop layer 102 include, but are not limited to, chemical vapour deposition and pulsed laser deposition.

In the next step of the method illustrated in FIG. 1 a thin film deposition technique is used to produce a beryllium layer 103 on an opposite side of the etch stop layer 102 than the carrier 101. Most advantageously the thickness of the beryllium layer 103 is between 0.5 and 8 micrometres. If the beryllium layer was thinner, its mechanical strength would be so low that the need for additional support solutions could easily mitigate the positive effects of the present invention. If the beryllium layer was thicker, its absorption might come too high concerning very sensitive X-ray fluorescence measurements, like the detection of sodium.

Also the beryllium layer 103 should be made as even and as pinhole-free as possible. An important difference to the prior art methods, where a beryllium layer was produced mechanically by rolling from an ingot, is the production of the beryllium layer 103 with a thin film deposition process, which typically will result in a much smaller grain size. Selecting the thickness of the layer to be produced at the accuracy of nanometres or tens of nanometres is easily achieved in many thin film deposition methods. Suitable methods for producing the beryllium layer 103 include, but are not limited to, sputtering, plasma assisted chemical vapour deposition, atomic layer deposition, and pulsed laser deposition.

In the next step the combined structure of the carrier 101, the etch stop layer 102 and the beryllium layer 103 is cut into pieces, so that a piece is suitably sized for use in one radiation window. As an example, the carrier might have originally been a silicon wafer with a diameter of several inches, while the diameter of a piece sufficient for a radiation window may be between 1 and 2 centimetres. On the other hand the invention does not limit the maximum size of a radiation window to be made. As another example, a radiation window according to an embodiment might have 50 millimetres as the diameter of the foil-covered opening for the radiation to pass through. Cutting the combined structure into pieces at this step of the method is not an essential requirement of the invention, but it is advantageous in the sense that a larger number of completed radiation windows can be very practically manufactured from a single original workpiece.

In the next step the piece of the combined structure comprising the carrier 101, the etch stop layer 102, and the beryllium layer 103 is attached to an annular region around an opening 104 in a support structure 105, with the beryllium layer 103 facing the support structure 105. For the attachment for example gluing or soldering can be used; the cross-section of an exaggeratedly thick layer of glue or solder 106 is schematically shown in FIG. 1. Also otherwise we may note that the illustrated dimensions are not to scale and not comparable to each other; they have been selected only for graphical clarity in the drawings. The fact that the carrier 101 is still present at the step of attaching those parts to the support structure that eventually will constitute the radiation window foil means that handling is easy and there is no need to worry about wrinkling or other kinds of deformation of the radiation window foil at this stage. The illustration of the glue or solder 106 is only schematic in FIG. 1, and it does not mean that a flat layer of glue or solder on the planar surface between the support structure 105 and the beryllium layer 103 would be the only possible alternative.

The descriptor "annular" should be understood in a wide sense. The invention does not require the support structure to have e.g. a circular form. It is sufficient that the support structure offers some edges and/or a region around the opening, to which the radiation window foil can be attached tightly and extensively enough to keep the radiation window foil in the completed structure securely in place, and—in those applications where gastightness is required—to form a gastight seal. In the last step illustrated in FIG. 1 the carrier 101 has been etched away, leaving only a radiation window foil comprising the etch stop layer 102 and the beryllium layer 103 to cover the opening 104 in the support structure 105. This phase of the method underlines the denomination of the etch stop layer 103. Etching is considered to be the most advantageous way of carefully removing the carrier while leaving the other layers intact. As an example, if the carrier 101 is made of silicon and the etch stop layer 102 is made of silicon nitride, potassium hydroxide (KOH) is one suitable etching agent, especially at a slightly elevated temperature like 70 degrees centigrade. In the etching stage it should be ensured that the etching agent only affects the side of the radiation window foil where the etch stop layer 102 exists. In doing so the support structure 105 can be utilized: for example, one may turn the structure so that the carrier faces upwards, and attach one end of a tubular shield to outer edges of the support structure 105, so that a "cup" is formed with the carrier-covered radiation window foil forming the bottom of the cup. The tubular shield will keep the etching agent poured into the cup from affecting other parts of the structure than the carrier.

After etching away the carrier, post-processing steps such as rinsing, drying, and testing may be applied according to need.

Figure 2:
FIG. 2 illustrates a method and a radiation window according to another embodiment of the invention.
Figure 2:
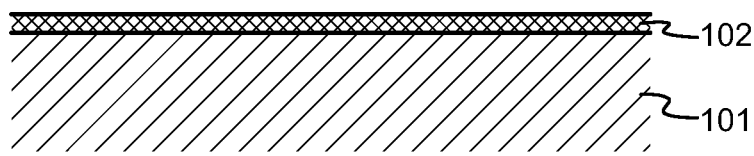
Figure 2:
Figure 2:
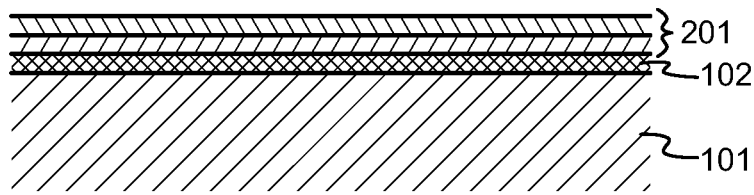
Figure 2:
Figure 2:
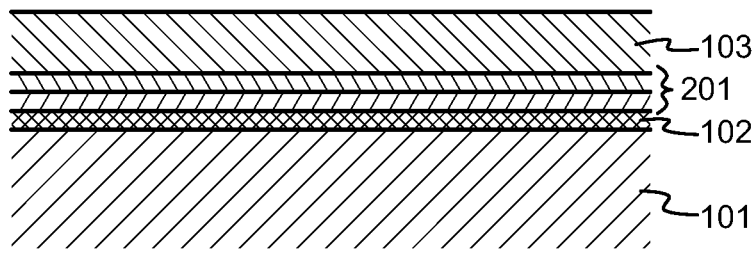
Figure 2:

FIG. 2 illustrates an optional addition to the basic method described above in association with FIG. 1. In the topmost illustrated step of FIG. 2, the etch stop layer 102 has been produced on a polished surface of the carrier 101. As the next step in FIG. 2 one or more diffusion barrier layers are produced on the etch stop layer 102. Together the one or more diffusion barrier layers constitute a layered diffusion barrier 201. One possible layered diffusion barrier of this kind is the so-called layered superbarrier, which consists of alternating aluminium oxide ($Al_2O_3$) and titanium oxide ($TiO_2$) layers. For example, in the middle step illustrated in FIG. 2 the formation of a layered diffusion barrier 201 may begin by depositing a 5 nanometres layer of titanium oxide, followed by a 20 nanometres layer of aluminium oxide, after which these deposition steps are repeated one after the other until the total thickness of the layered diffusion barrier 201 is in the order of 100 nanometres. This example is by no means limiting, and several other approaches may also be taken to produce the layered diffusion barrier 201. Any deposition method can be used; for example atomic layer deposition has been reported to work well in the production of this kinds of layered structures.

The lowest step illustrated in FIG. 2 represents using a thin film deposition technique to produce a beryllium layer 103. Although there is now the layered diffusion barrier 201 in between, the beryllium layer 103 is still on an opposite side of the etch stop layer 102 than the carrier 101, which is important taken that the carrier 101 should later be removed in an etching process the effect of which should end at the etch stop layer 102. From this step the method of manufacturing a radiation window continues to cutting the radiation window foil into size for radiation window(s), like in the fourth step of FIG. 1.

Figure 3:
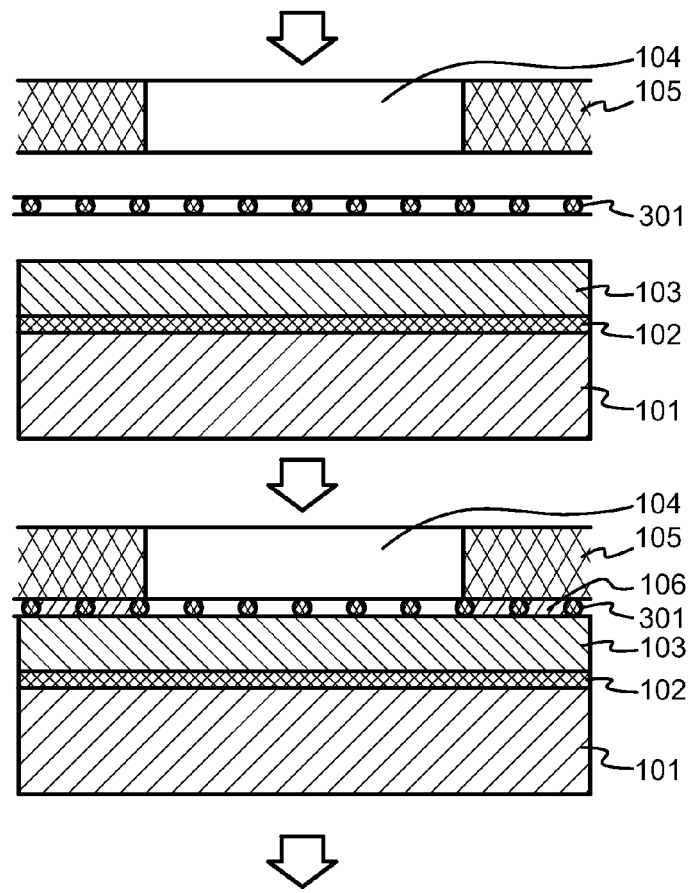
FIG. 3 illustrates a method and a radiation window according to yet another embodiment of the invention.

FIG. 3 illustrates another optional addition to the methods described above. The embodiment of FIG. 3 is here shown combined with the embodiment of FIG. 1, i.e. without a layered diffusion barrier, but it could quite as well be combined with the embodiment of FIG. 2 so that the layered diffusion barrier would be included.

After the combined structure comprising the carrier, the etch stop layer, and the beryllium layer has been cut into size, it becomes actual to attach it to an annular region around an opening in a support structure with the beryllium layer facing the support structure. In the upper step illustrated in FIG. 3 a reinforcement mesh 301 is placed therebetween, so that after attaching the reinforcement mesh 301 remains sandwiched between the support structure 105 and the layered window foil at said annular region, and stretches across the opening 104 together with the layered window foil. The same glue or solder 106 can be used to attach all components together; alternatively or additionally the reinforcement mesh 301 can be first separately glued, soldered, or otherwise attached to one of the support structure 105 or the combined structure comprising the carrier, the etch stop layer, and the beryllium layer.

After the attaching the process continues to etching away the remaining carrier. Using a reinforcement mesh is particularly advantageous if the radiation window will separate spaces with a large pressure difference therebetween, and/or if enhanced mechanical strength is otherwise desired, and/or if the beryllium layer is very thin. As a first estimate, radiation windows according to embodiments of the invention where the thickness of the beryllium layer is less than 3 micrometres would greatly benefit from the use of a reinforcement mesh.

It is possible to attach the reinforcement mesh to the radiation window foil by using a positive-working photosensitive glue, as explained in U.S. Pat. No. 7,618,906, prior to attaching the combined structure to the support structure. The use of positive-working photosensitive glue has the inherent advantage that the reinforcement mesh can itself act as the mask that is needed to ensure proper curing of the glue at only desired locations. It will keep the reinforcement mesh attached to the completed radiation window foil also throughout the opening in the support structure, which reduces the unwanted mechanical wear that the reinforcement mesh could otherwise cause to the foil.

It is also possible to use a reinforcement mesh on that side of the completed radiation window foil that has the etch stop layer. It should be noted that the thickness of the radiation window foil in relation to the diameter of the opening 104 has been widely exaggerated in the drawings; in practice the opening may have a diameter of several millimetres (even tens of millimetres), while the overall thickness of the radiation window foil is only some micrometres. Therefore a possible reinforcement mesh on the etch stop layer side would not need to bulge significantly from the surface of the support structure 105 where its edges would be attached.

Figure 4:
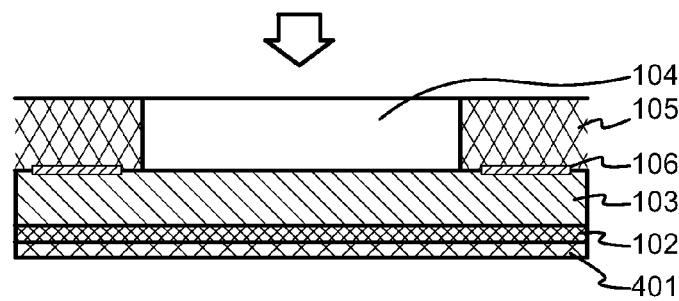
FIG. 4 illustrates a method and a radiation window according to yet another embodiment of the invention.

FIG. 4 illustrates yet another optional addition that can be added to any of the methods described above. According to FIG. 4, after etching away the carrier, there is produced one or more additional layers 401 on the exposed etch stop layer 102. For example, if the beryllium layer 103 that has been described so far is called a first beryllium layer, the radiation window may comprise a second beryllium layer as the additional layer 401 on an opposite side of the etch stop layer 102 than said first beryllium layer 103. Using a second beryllium layer may be advantageous especially if it is possible that the first beryllium layer 103 may contain pinholes. The additional layer 401 may also be an aluminium layer, which would have a role in blocking out unwanted wavelengths of electromagnetic radiation, such as visible light. An aluminium layer and/or other layers could also be produced on that side of the first beryllium layer 103 that will face the support structure 105, before making the attachment.

Figure 5:
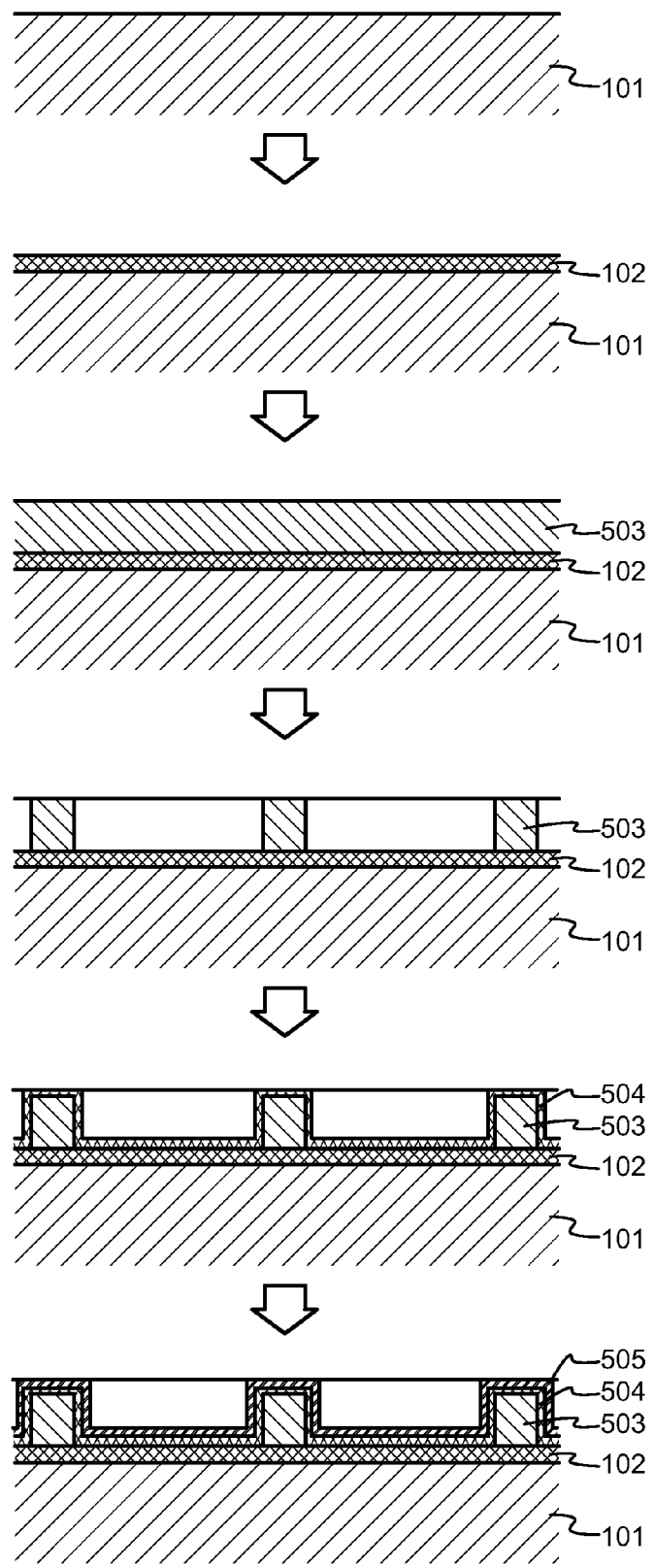
FIG. 5 illustrates a part of a method and radiation window according to yet another embodiment of the invention.

FIG. 5 illustrates a first part of a radiation window manufacturing method according to yet another embodiment of the invention. The two topmost steps are comparable to corresponding steps in FIG. 1 earlier. Thus the topmost step illustrates a carrier 101, at least one surface of which has been polished and faces upwards. The required smoothness is evaluated by the same criterion as earlier, i.e. the aim of covering it with an essentially continuous etch stop layer with uniform thickness in the order of 10 to 200 nanometres. Again, a silicon wafer is a good example, but the carrier 101 may be made of some other solid material that is etchable with some reasonably common and easily handled etching agent and that can be polished to the required level of smoothness.

An etch stop layer 102 is produced on the polished surface of the carrier 101. The main objective of the etch stop layer 102 is to keep an etching agent, which in a later process step will appear from below and remove the carrier 101, from affecting those layers that come on top of the etch stop layer 102. Therefore the material for the etch stop layer 102 should be selected so that it will not be affected to any significant degree by an etching agent that works effectively on the material of the carrier 101. Additionally the material of the etch stop layer 102 should be applicable for deposition in thin layers (in the order of 10 to 200 nanometres), and it should neither significantly absorb radiation nor produce any awkwardly handled anomalies at the wavelengths of electromagnetic radiation at which the radiation window is to be used. Further advantageous characteristics of an etch stop layer include corrosion resistance against environmental conditions during the use of an X-ray measurement apparatus, and good adhesion properties for further layers to be deposited thereon. If the carrier 101 is made of silicon, one advantageous material for the etch stop layer 102 is silicon nitride. The deposition of the etch stop layer 102 should take place as uniformly as possible, especially avoiding any remaining pinholes in the etch stop layer. Suitable methods for depositing the etch stop layer 102 include, but are not limited to, chemical vapour deposition and pulsed laser deposition.

At the third step of FIG. 5, a structural layer 503 is manufactured on the etch stop layer 102 using a thin film deposition technique. At first, the structural layer 503 is uniform. It can consist of e.g. 3 to 10 micrometres of beryllium, but in this embodiment of the invention it is believed to be even more advantageous if the structural layer 503 consists of about 5 to 30 micrometres of silicon, preferably in the form of polycrystalline silicon (also known as polysilicon). Also other materials could be used. The criteria to be applied in choosing the material for the structural layer 503 include reasonable mechanical strength, good binding to the etch stop layer 102, suitability to etching with an etching method and/or agent that does not affect the etch stop layer 102 to a significant extent, low absorption of radiation, absence of disturbing fluorescence peaks and/or other awkwardly handled anomalies at the wavelengths of electromagnetic radiation at which the radiation window is to be used, as well as easy handling in a thin film deposition process. For example beryllium has all other desired characteristics but does not meet the last criterion in full because of its toxicity. Polysilicon on the other hand fulfils all criteria listed above.

The following step in the method of FIG. 5 can be included, if the etch stop layer is uniform enough to alone constitute the basic continuous layer of the radiation window foil. Namely, in the fourth step from above in FIG. 5, regularly spaced portions of the originally uniform structural layer 503 are removed to turn said uniform layer into a mesh. The characteristic dimensions of the mesh may include for example a diameter of openings in the order of 20 to 200 micrometres, and a width of the ribs in the mesh in the order of 5 to 20 micrometres. Assuming that the process of turning the originally uniform layer into a mesh does not significantly affect those parts of the layer that are to form the ribs, the height (the dimension in the vertical direction in FIG. 5) of the ribs constituting the mesh will be essentially the same as the original thickness of the uniform layer. These dimensions are examples only, and the eventual selection of characteristic dimensions should be made in accordance with the mechanical strength that the completed radiation window should have. Several methods for turning a previously uniform, thin-film-deposited layer into a mesh layer are known, including but not being limited to photolithography, wet etching, dry etching, plasma etching, electron beam lithography, and ion beam lithography. The method should naturally be selected so that it still leaves the etch stop layer 102 continuous.

As an alternative to openings that cut all the way through the structural layer, the fourth step from above in FIG. 5 can also comprise reflectively removing from the structural layer an array of portions that are smaller in height than the total thickness of the structural layer. This alternative can be used especially if it is possible that the etch stop layer is not uniform enough or not strong enough to alone constitute the basic continuous layer of the radiation window foil. Selectively removing said array of portions will leave intact a thin continuous part of the structural layer closest to the etch stop layer, which means that the etch stop layer and said thin continuous part of the structural layer will together constitute the basic continuous layer of the radiation window foil.

The next step illustrated in FIG. 5 is optional and can be included if it is desirable to have an additional diffusion barrier in the radiation window foil. A conformal diffusion barrier layer 504 is formed on top of the mesh that remains of the structural layer 503. The method for producing the diffusion barrier layer 504 can be selected freely, as long as the result is a reasonably smooth, conformal, and thin layer of appropriate materials. As an example, atomic layer deposition may be used to produce a diffusion barrier layer that consists of five to ten alternating layers of aluminium oxide $Al_2O_3$ and titanium oxide $TiO_2$. Exemplary layer thicknesses could be 5 to 10 nanometres for the former and 2 to 5 nanometres for the latter.

Similarly the last step illustrated in FIG. 5 is optional and can be included if it is desirable to have a visible light blocking layer in the radiation window foil. The most typical material used for a visible light blocking layer is aluminium with a layer thickness of 30 to 100 nanometres. Also a beryllium layer of 100 to 400 nanometres could be used, or any other material and layer thickness that attaches well to the previous layer and fulfils the task of blocking visible light without causing other effects that would interfere with the radiation measurement for which the radiation window is made.

The third and fourth steps in FIG. 5 may be commonly referred to as the mesh-making step. The two last steps (producing a diffusion barrier and producing the visible light blocking layer) and the mesh-making step could basically be performed in any mutual order, but it should be noted that a diffusion barrier layer or a visible light blocking layer also offers a reasonably good protection against corrosion, for which reason it is advisable to have one of these two layers as the topmost layer after performing the steps illustrated in FIG. 5. At least one of the diffusion barrier or the visible light blocking layer could also be produced later in the process and at a different side of the structure, as will be described later.

Figure 6:
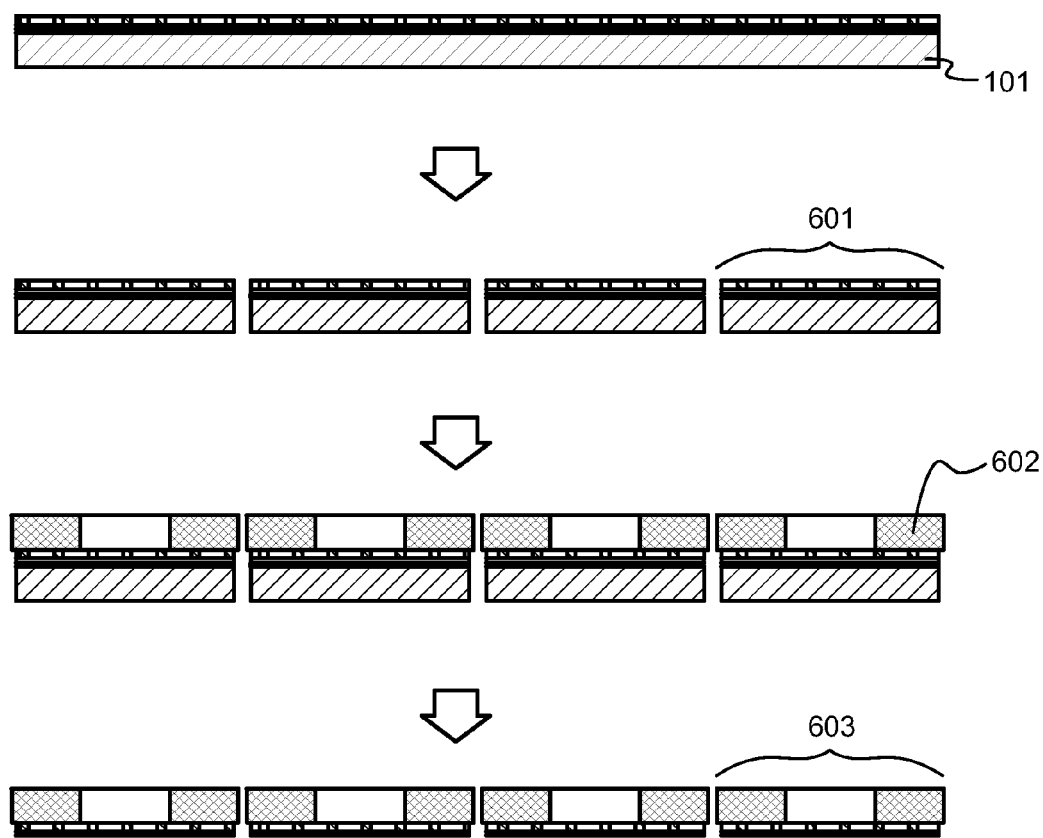
FIG. 6 illustrates a further part of the method and radiation window introduced in FIG. 5.

In FIG. 6 the starting point is the same at which the first part of the method ended in FIG. 5: on top of a carrier 101 (such as a 6-inch silicon wafer, for example) there exist layers, of which the mesh layer is most clearly visible due to the visible cross sections of the mesh ribs (although also in this drawing the dimensions have only be selected for graphical clarity and are not in scale). In the next step the carrier with the layers on its surface is cut into workpieces, of which workpiece 601 is an example. The size of the workpieces is selected so that a workpiece covers an annular opening defined by a support structure, and additionally extends onto the solid surface of the support structure around said annular opening. The reason for this dimensioning becomes apparent in the third step of FIG. 6, where each workpiece is glued, soldered, welded or otherwise attached to a support structure. Of these, support structure 602 is shown as an example. The attachment to the support structure is made on that side of the cut workpiece that comprises the layers; in other words, the etch stop layer, the structural layer, and the possible diffusion barrier and visible light blocking layers become sandwiched between the support structure and the carrier.

The last step in FIG. 6 shows removing the carrier, which is most advantageously done by etching. If the carrier was originally a silicon wafer, an easily applicable method for removing the carrier is etching in a hot potassium hydroxide (KOH) solution. The etch stop layer keeps the etching agent from affecting the remaining layers of the radiation window foil. Even if some of them would be slightly affected at the very edge of the piece of radiation window foil that remains attached to the support structure, the porous nature of the mesh layer tends to slow down the propagation of the etching reaction in the direction that is horizontal in FIG. 6, which means that effects of the etching to the remaining radiation window foil remain negligible. The result is a completed radiation window, illustrated with the reference designator 603.

Above it was noted that at least one of the diffusion barrier or the visible light blocking layer could also be produced later in the process than what was explained earlier. At least one of them, or even both in succession, could be produced on the surface of the etch stop layer that was exposed by etching away the carrier. However, making the diffusion barrier and the visible light blocking layer earlier in the process may be more advantageous, because up to the cutting of the carrier the process can typically be conducted within a single clean room with virtually no exposure at all to dust or impurities. Keeping the produced layers very pure and free of contaminants, up to a level that is difficult to achieve otherwise than within confinement to clean room, is advantageous because it helps to avoid spurious fluorescence and other unwanted effects when the radiation window is later used in a measurement apparatus.

As with the case of using e.g. positive-working photosensitive polymer as a glue, which was explained earlier in this description, the method of FIGS. 5 and 6 involves the inherent advantage that each and every rib of a reinforcement mesh is and remains fixedly attached to the continuous part of the radiation window foil. Consequently the radiation window foil exhibits significant mechanical strength irrespective of the sign of the pressure difference across the radiation window. Additionally all microscopic movements of the mesh relative to the continuous part of the radiation window foil are excluded, which removes the risk of mechanical wear therebetween. These are significant differences to e.g. the radiation windows described in the prior art publication US 2008/0296518 A1, in which the continuous part of the radiation window foil is a separate (typically polymer) film that is just laid across the top surface of a support mesh. It should be noted that the author of said reference document specifically emphasizes the corresponding drawbacks by pointing out the significance of rounding and smoothing the upper edges of the ribs.

Said prior art publication discloses also an embodiment in which the ribs, the support frame and the continuous film include a same material. The present invention has the difference and significant advantage over such a solution that since the ribs, the support structure and the continuous film are here all manufactured of a material of their own, there is no need for unsatisfactory compromises such as selecting a material that is not actually optimal for any of said individual purposes but qualifies only barely for each of them.

Figure 7:
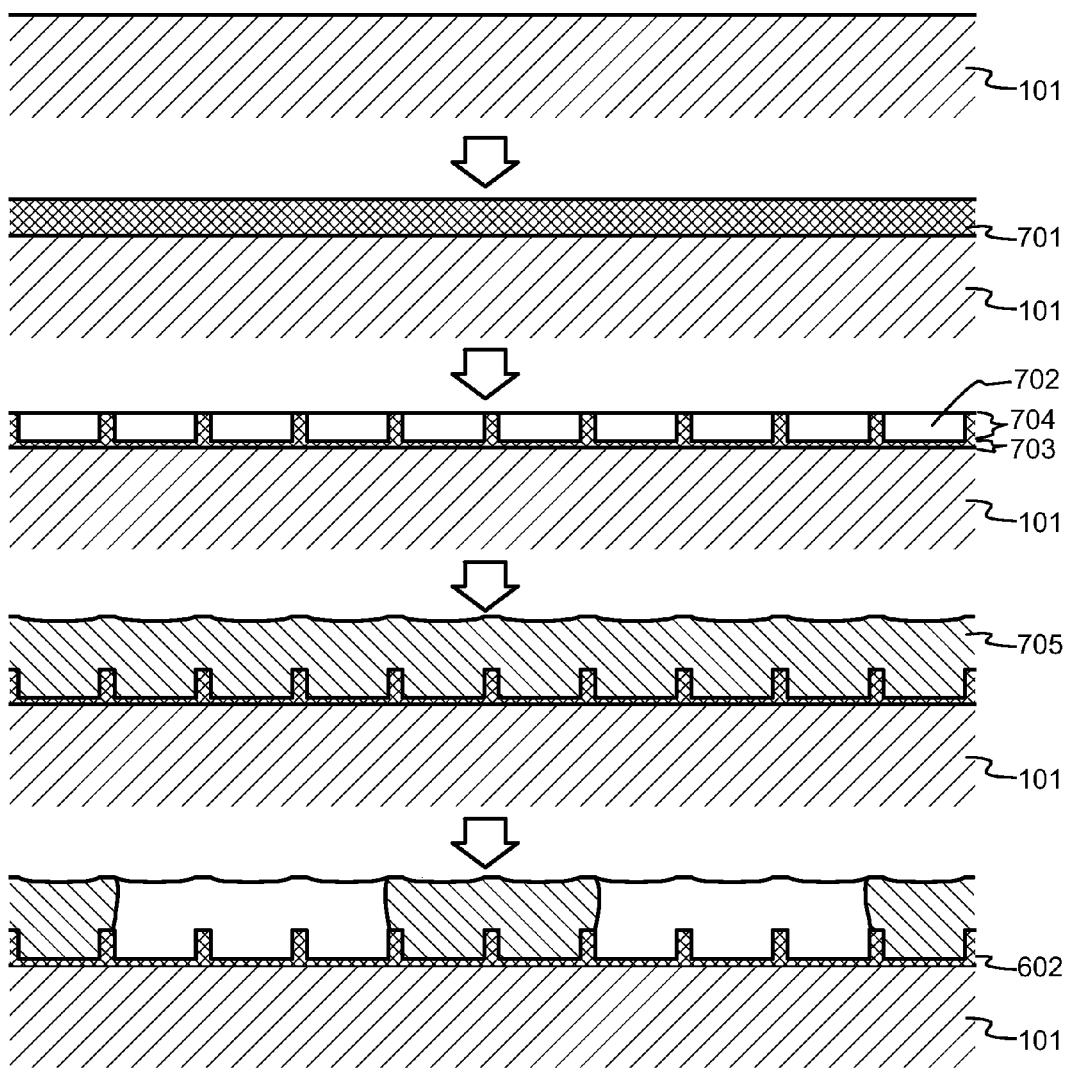
FIG. 7 illustrates a part of a method and radiation window according to yet another embodiment of the invention.
Figure 8:
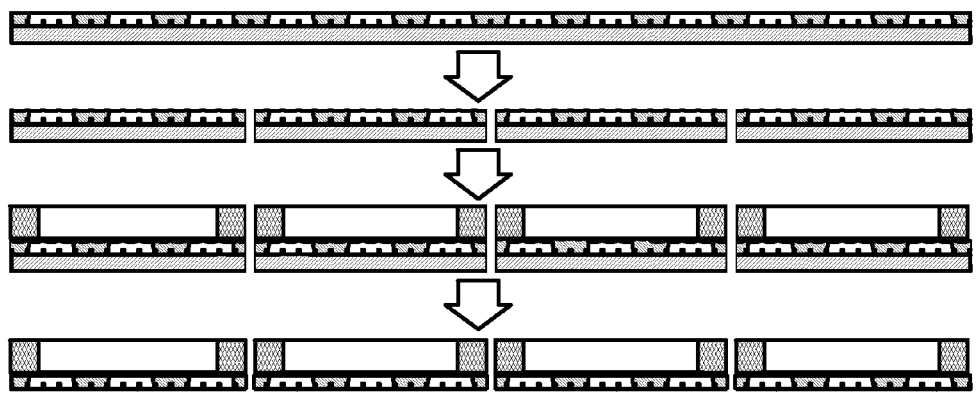
FIG. 8 illustrates a further part of the method and radiation window introduced in FIG. 7.

FIGS. 7 and 8 illustrate a method for manufacturing a radiation window for an X-ray measurement apparatus. The lowest part of FIG. 8 illustrates also a radiation window manufactured with said method. A particular advantage of this method, and also a particular advantage of the resulting radiation window, is a very small thickness of a large majority of that part of the window through which the X-rays will pass. Consequently the radiation window strikes a very advantageous balance between high mechanical strength and low attenuation of X-rays.

As illustrated at the top of FIG. 7, the method begins again with providing a carrier 101, a surface of which is polished or otherwise smooth enough to be used as the basis on which an essentially continuous etch stop layer is produced. Here the etch stop layer is illustrated with reference designator 701 to emphasize that in this embodiment of the invention it is possible that the etch stop layer, when manufactured, should or is allowed to be somewhat thicker than in the embodiments of the invention that have been described so far. Of the previously mentioned thickness range of 10 to 1000 nanometres, the thickness of the etch stop layer 701 is likely to be closer to the upper end or even above it. However, there is no particular requirement for any minimum thickness of the etch stop layer even in this case, but its original thickness can be selected according to considerations that will become more evident in the following description of how the method continues.

The third step in FIG. 7 illustrates an important difference to the previously explained embodiments of the invention. Instead of leaving the etch stop layer intact and uniformly thick, there is now selectively removed an array of portions that are smaller in height than the total thickness of the etch stop layer. In other words, an array of cavities are formed in the etch stop layer, of which cavity 702 is shown as an example. The cavities could also be characterised as cup-formed dents or depressions. As a result, the etch stop layer now comprises a continuous foil part 703 and a mesh part 704 that constitutes an integral entity with the continuous foil part 703. The integrity of said entity is clear, because both the continuous foil part 703 and the mesh part 704 were originally portions of the same, uniform, and continuous etch stop layer.

Methods for selectively removing an array of portions from a layer up to a limited depth, i.e. methods for producing an array of cup-formed dents or depressions without penetrating through the layer, are known especially from the technology of manufacturing semiconductor components. They often combine photolithography, electron beam lithography or ion beam lithography with subsequent anisotropic etching, such as plasma etching. It should be noted that even if the etch stop layer is by definition resistant to certain forms of etching, this refers particularly to such etching that will eat through the material of the carrier 101 (and, later, through the material of the structural layer to be formed on top of the etch stop layer). By using different etching agents, different reaction conditions, and/or other differently selected process parameters it is possible to etch even the material of the etch stop layer. Not penetrating all the way through the etch stop layer helps, because the remaining continuous foil part will protect the underlying carrier. Another possible method for selectively and controllably removing very accurately defined portions of a layer to a desired depth is laser ablation, in which very short laser pulses are repeatedly focussed onto the layer to be machined in order to create a local energy density high enough to blast some material away. The invention does not limit the selection of the method used to selectively remove an array of portions from the etch stop layer 701.

As with the previous drawings, also here the dimensions have been selected in view of graphical clarity and are not necessarily to scale. Namely, the thickness of the continuous foil part 703 may be as little as a few nanometres, for example 15 nanometres, even if the thickness of the mesh part 704 may equal the remainder of the original thickness of the etch stop layer. In other words, the thickness of the mesh part 704 (i.e. the height of the ribs in the mesh part 704) may be ten times or dozens of times the thickness of the continuous foil part 703. The pitch of the mesh part 704, i.e. the distance between adjacent ribs (or, in other words, the diameter of the cavities) may be selected in relation to the selected thickness of the continuous foil part 703 and the desired mechanical strength of the completed radiation window foil. In an exemplary embodiment of the invention the pitch of the mesh part 704 may be in the order of tens of micrometres, for example 20 micrometres.

In the fourth step illustrated in FIG. 7 a thin film deposition technique is used to produce a structural layer 705 on the etch stop layer, which was above turned into a combination of a continuous foil part 703 and a mesh part 704. The carrier 101 still acts as a support of the radiation window foil in general and the (possibly very thin) continuous foil part 704, so the structural layer 705 naturally comes on the opposite side of the etch stop layer than the carrier 101. Because the basis on which the structural layer is deposited, i.e. the exposed surface of the etch stop layer, is not even but exhibits the ribs of the mesh part 704, it is possible that the structural layer 705 will not become completely even on its eventual top surface. However, depending on the achieved thickness of the structural layer 705, and also depending on the thin film deposition technique used, even an essentially smooth top surface may result.

The fifth step illustrated in FIG. 7 resembles the fourth step of FIG. 5 in that it involves removing regularly spaced portions of the originally uniform structural layer 705 to turn also this originally uniform layer into a mesh. Lithography methods and etching is again most suitably used to remove said portions. This time the etch stop layer will act according to its name, and stop the etching in the vertical direction. The good resistance of the etch stop layer to such etching that eats through the material of the structural layer is an advantage, because it ensures that all remnants of the structural layer can be removed even from the cavities that remain between the relatively high ribs in the mesh defined by the surface of the etch stop layer that becomes exposed.

According to an embodiment of the invention, the pitch of the mesh formed of the structural layer is larger than the pitch of the mesh that was previously formed of the etch stop layer. In other words, the mesh part of the etch stop layer defines smaller openings than the mesh layer that remains from the structural layer and is fixedly attached to said etch stop layer, so that a plurality of openings of the mesh part fit in one opening of the mesh layer. In order to take full advantage of the very thin (and consequently very-low-attenuation) cavity bottoms in the etch stop layer, it is advantageous to align the ribs that remain from the structural layer with the ribs that belong to the mesh part of the etch stop layer. Thus the vertical edges of the ribs that remain from the structural layer coincide with selected ribs that belong to the mesh part of the etch stop layer. Such aligning is naturally only possible if the ribs in both meshes are parallel with each other. The invention does not require them to be parallel; and indeed the invention does not even require the openings or cavities in the two meshes to have same or similar form. It is possible to use for example hexagonal cavities in the mesh part of the etch stop layer and rectangular or diamond-formed openings in the mesh that remain from the structural layer, or vice versa, or to use some other forms for the openings and cavities.

Practical considerations dictate that the ribs that remain from the structural layer are also wider in the horizontal direction than the ribs in the mesh part of the etch stop layer. Namely, since the original thickness of the structural layer was typically from a few micrometres to some tens of micrometres, it might be difficult to manufacture as narrow ribs as in the etch stop layer without the ribs becoming unacceptably brittle. The same examples can be used as previously in association to FIG. 5: the diameter of openings in the mesh remaining from the structural layer could be in the order of 20 to 200 micrometres, and a width of the ribs in said mesh could be in the order of 5 to 20 micrometres. The lowest part of FIG. 7 suggests that a rib in the mesh remaining from the structural layer could fill two adjacent cavities in the mesh part of the etch stop layer, but more probably the rib would only fill one cavity. Taken together with the previously formulated aim of aligning the ribs in the two meshes, this means that the width of the ribs in the mesh remaining from the structural layer would be approximately equal to the pitch of the mesh part of the etch stop layer.

The topmost part of FIG. 8 is comparable to the lowest part of FIG. 7 in that also in the topmost part of FIG. 8 the carrier 101 is still intact and exhibits the double mesh structure manufactured on its one surface. The second step in FIG. 8 illustrates cutting the mesh-covered carrier into smaller parts, each of which is to eventually constitute a radiation window. The third step in FIG. 8 illustrates attaching each part across the opening defined by a (typically annular) support structure, and the last step in FIG. 8 illustrates etching away the carrier from each radiation window to be completed. Thus the steps illustrated in FIG. 8 are fully comparable to those illustrated earlier in FIG. 6, with the only difference that the structure of the radiation window foil now includes the double mesh structure.

Figure 9:
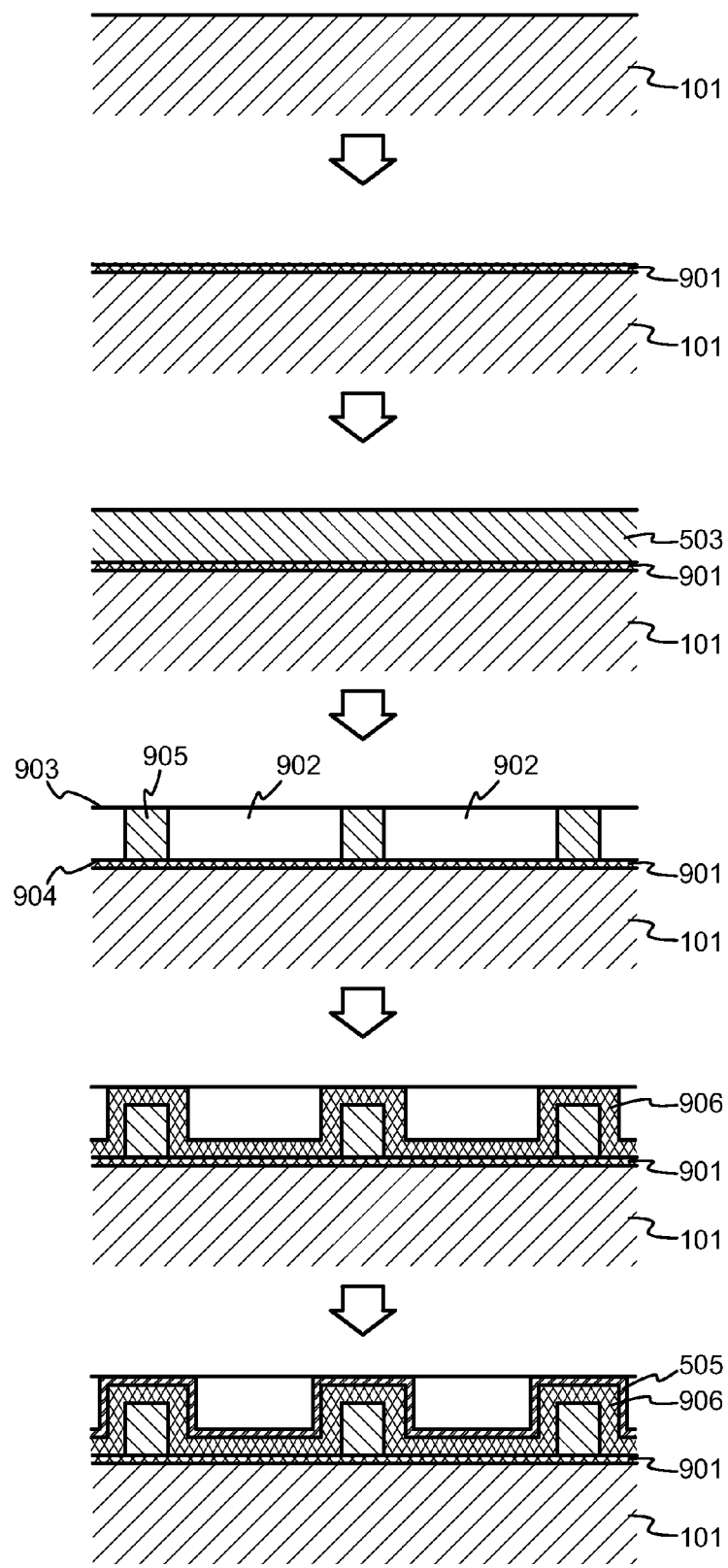
FIG. 9 illustrates a part of a method and radiation window according to yet another embodiment of the invention.

FIG. 9 illustrates a variation from the theme that was introduced earlier in FIG. 5. In the topmost step of FIG. 9 a carrier 101 is provided, a surface of which has been polished and faces upwards. The required smoothness of the surface is evaluated essentially by the same criterion as earlier, i.e. the aim of covering it with an essentially continuous etch stop layer. In the embodiment of FIG. 9 the etch stop layer that comes on said surface might be thinner than in some embodiments discussed earlier. At least in some cases that might mean that the surface of the carrier must be polished to a smoothness that is slightly better than what could be accepted in some other embodiments of the invention. However, as was pointed out earlier, for example silicon wafers are routinely polished to achieve rms roughness values in the order of fractions of a nanometre, which is still quite sufficient for the purposes of also the embodiment of FIG. 9.

Producing the etch stop layer 901 on the carrier is illustrated as the second step in FIG. 9. A different reference designator (901) is used here to underline that the etch stop layer 901 might be thinner than in some other embodiments. In the embodiment of FIG. 9 it does not necessarily have any other function than stopping an etching agent from propagating in a certain later processing step, which means that only a few nanometres (e.g. 5 nanometres) may be a sufficient thickness for the etch stop layer 901. No upper limit exists, but since all layers in a radiation window foil should be optimized for minimized unwanted attenuation of X-rays, the thinner the etch stop layer 901 the better, as long as it remains capable of fulfilling its etch stop function. A practically considered upper limit for the thickness of the etch stop layer 901 could be in the order of a few hundred nanometres. Silicon nitride is again a readily available candidate for the material of the etch stop layer 901, but other materials can be used as long as they are resistant enough against the method (like etching) that will be later used to detach the radiation window foil from the carrier 101.

The third step in FIG. 9 illustrates producing a structural layer 503 on the etch stop layer 901. Just like in the method of FIG. 5, at first the structural layer 503 is uniform. Also the criteria for selecting the material and thickness of the structural layer 503 are essentially the same as those listed earlier in association with the embodiment of FIG. 5. As an example, the thickness of the structural layer 503 could be between 3 and 10 micrometres. Examples of materials that can be used to produce the structural layer 503 include, but are not limited to, polycrystalline silicon and beryllium. The material should have good tensile strength, relatively low attenuation of X-rays, and good adhesion to the etch stop layer 901. It should not exhibit X-ray fluorescence at awkward wavelengths that could overlap with particularly interesting X-ray fluorescence wavelengths to be measured. It is advantageous if the material of the structural layer 503 has thermal expansion characteristics that are close to those of the etch stop layer 901.

In the fourth step from above in FIG. 9, regularly or irregularly spaced portions of the originally uniform structural layer 503 are removed to turn said uniform layer into a mesh that defines a number of openings. The characteristic dimensions of the mesh may include for example a diameter of openings in the order of 20 to 200 micrometres, and a width of the ribs in the mesh in the order of 5 to 20 micrometres. Assuming that the process of turning the originally uniform layer into a mesh does not significantly affect those parts of the layer that are to form the ribs, the height (the dimension in the vertical direction in FIG. 9) of the ribs constituting the mesh will be essentially the same as the original thickness of the uniform layer. These dimensions are examples only, and the eventual selection of characteristic dimensions should be made in accordance with the mechanical strength that the completed radiation window should have. Several methods for turning a previously uniform, thin-film-deposited layer into a mesh layer are known, including but not being limited to photolithography, wet etching, dry etching, plasma etching, electron beam lithography, and ion beam lithography. The method should naturally be selected so that it still leaves the etch stop layer 901 continuous.

Together, the third and fourth steps in FIG. 9 constitute the so-called mesh-making step. As a result, there is seen in the fourth step of FIG. 9 a mesh that defines a number of openings 902. The mesh has a first side surface 903, and a second side surface 904 that is immediately against the etch stop layer 901. Thus the first side of the mesh is its upper side in FIG. 9, and the second side of the mesh is its lower side in FIG. 9. The mesh comprises ribs 905 that have tops directed towards the first side (i.e. upwards in FIG. 9) and bottoms directed towards the second side (i.e. downwards in FIG. 9) of the mesh. The tops of the ribs define the first side surface 903, and the bottoms of the ribs define the second side surface 904.

The next step in FIG. 9 illustrates an example of covering the mesh with a layer 906 on the first side of the mesh. Taken the orientation in FIG. 9. the layer 906 is thus added from above, by using a thin film deposition technique that produces an essentially continuous, essentially conformal layer. Sputtering and atomic layer deposition are examples of methods that can be used to produce the layer 906, but any method can be used that fulfils the requirements of producing an essentially continuous and conformal layer.

Examples of materials that can be used to produce the layer 906 include, but are not limited to, boron, boron nitride, beryllium, beryllium nitride, pyrolytic graphite, diamond-like carbon, aluminium, polymer, calcium, lithium carbonate, lithium nitride, lithium hydride, lithium boron oxide, lithium borate glass, and composite materials. The thickness of the layer 906 is typically less than one micrometre, but essentially more than the thickness of the etch stop layer 901. The embodiment of FIG. 9 aims at eventually producing a radiation window foil where the layer 906 will constitute a so-called actual window layer. This means that in each opening defined by the mesh, it is the layer 906 that carries a majority of the mechanical stress caused by the possible difference in pressure on different sides of the radiation window foil. This explains the difference in thickness between the etch stop layer 901 and the layer 906 in this embodiment: the latter may in some cases be more than hundred times thicker than the former.

The last step illustrated in FIG. 9 is optional and can be included if it is desirable to have one or more material layers 505 on top of layer 906 on the first side of the radiation window foil. Such material layers could be used to block visible light; to block some other undesired wavelengths of electromagnetic radiation; to enhance the corrosion resistance of the radiation window foil; to further decrease the diffusion of gaseous substances through the radiation window foil; to intentionally build into the radiation window foil the property of producing some desired fluorescence peaks; or for any other purpose.

The last step illustrated in FIG. 9 should be followed by a step of detaching the radiation window foil, which now comprises e.g. the mesh and the layer 906, from the carrier 101. The detaching step may comprise for example cutting the combined carrier and radiation window foil into workpieces, attaching a workpiece to a support structure, and etching away the carrier 101. The last-mentioned part explains the designation of the etch stop layer 901; it will keep the etching agent from propagating to the mesh, the layer 906, and the possible one or more material layers 505 on top of layer 906, while allowing the carrier to be etched away.

FIG. 10 is a partial cut-out representation of a radiation window foil manufactured with a method in accordance with FIG. 9. The radiation window foil comprises a mesh that defines a number of openings; here the openings are hexagonal in shape. Ribs 905 of the mesh are seen in the illustrated cross section. The mesh has a first side surface defined by the tops of the ribs 905, and a second side surface defined by the bottoms of the ribs 905. A layer 906 spans the openings in the mesh, however so that even if the layer 906 is on the first (top) side of the mesh, it spans the openings at a level that is closer to the second (bottom) side surface of the mesh than the first (top) side surface of the mesh. In the illustrated cross section the layer 906 is seen to meander around the ribs of the mesh, so that the layer 906 spans the openings at a level where it is flush with the bottoms of the ribs, and it climbs up the sides of the ribs to cover the tops of the ribs on the first (top) side of the mesh.

The invention does not require the layer 906 to span the openings flush with the bottoms of the ribs. FIG. 11 illustrates an embodiment where the mesh was first covered with at least one further layer 1101, which in the completed radiation window foil exists between the layer 906 and the ribs of the mesh. Consequently layer 906 spans the openings at a level where the layer 906 is separated from the plane of the bottoms of the ribs by the thickness of said at least one further layer 1101. Remembering that the height of the ribs in the mesh may be several micrometres, and that thin layers like the further layer 1101 in a radiation window foil can have thicknesses in the order of nanometres, the layer 906 still spans the openings at a level closer to the second (bottom) side surface of the mesh than the first (top) side surface of the mesh.

FIG. 12 illustrates an embodiment in which at least one further layer 1201 has been produced on the etch stop layer 901 before depositing the structural layer from which the mesh was eventually produced. This is possible, but care should be taken in selecting the materials and processing parameters, in order not to loose the advantages that could be gained by producing the mesh directly on the etch stop layer. As an example, if the etch stop layer is made of silicon nitride and the mesh is made of polycrystalline silicon directly on top of it, very good adhesion can be achieved therebetween. It is also advantageous that the coefficients of thermal expansion are almost the same for silicon nitride and polycrystalline silicon.

In the embodiments of FIGS. 11 and 12 the at least one further layer 1101 or 1201 can be e.g. a diffusion barrier layer or -multilayer. Another purpose for at least one further layer 1101 or 1201 could be to act as a matching layer that matches the other layers better with each other, for example in terms of the structural parameters of crystallization. The principles illustrated in FIGS. 11 and 12 could be combined so that at least one further layer extends flat across the surface of the etch stop layer like layer 1201, and at least one yet further layer meanders around the ribs of the mesh like layer 1101. It is also possible to combine the use of at least one further "intermediate" layer (like any one of those illustrated as 1101 or 1201) with one or more material layers 505 on top of layer 906 on the first side of the radiation window foil (see FIG. 9).

Tests of a radiation window foil according to FIG. 10 have shown that it has good mechanical strength, as well as a truly exceptional endurance of high temperatures. FIG. 13 may offer some explanations to these advantageous properties. As an example, we may assume that the coefficient of thermal expansion of the mesh material (e.g. polysilicon) differs from that of the layer 906 material (e.g. beryllium).

A change in temperature may cause the layer 906 to contract more than the mesh. This causes tensions in the structure. However, since the layer 906 is only flat across a relatively small opening, and meanders around the ribs of the mesh at all sides of said opening, the tensions occurring within one opening are effectively decoupled from those occurring in the adjacent openings. FIG. 13 has arrows to illustrate the mutually decoupled, opening-specific tensions in one direction.

This decoupling effect is a significant difference to all previously known radiation window foils where the major, load-bearing gastight layer is a continuous film that extends flat across the whole radiation window. If a reinforcing grid is only located on one side of such a continuous film, like on prior art radiation window foils, tensions in the film accumulate over large areas, easily leading to a mechanical failure of the radiation window foil. Prior art radiation window foils are known to have allowed temperature ranges of only some tens of degrees, while a radiation window according to an embodiment of the invention with a beryllium layer meandering around a polycrystalline silicon mesh was successfully tested at 160 (one hundred sixty) degrees centigrade. This is not believed to be a limiting temperature for the radiation window foil, but was limited by an epoxy that was used in the design of the radiation window. A foil with a silicon nitride (etch stop) layer and a polysilicon mesh was successfully tested at about 1000 (one thousand) degrees centigrade.

The good mechanical strength can also be understood as a consequence of avoiding the concentration of mechanical loading to limited, line-like areas. If a prior art radiation window foil, where a continuous film extends across flat on top of grid, is loaded by pressure difference, the ribs of the grid act like knives that press into the continuous film, causing line-shaped local loading and often initiating mechanical failure. In a radiation window foil according to an embodiment of the present invention the load is distributed over a larger region within the parts where the layer 906 meanders around the ribs of the mesh.

It should be understood that an important part of the mechanical strength of radiation window foils according to embodiments of the invention stem from the structural solution, not from the selection of some particular materials. This opens the door to the use of materials and/or material thicknesses that have previously been considered unsuitable for radiation window foils because of their insufficient mechanical strength.

Exemplary thin film deposition techniques for producing the layers mentioned above have already been considered. As a subgenus of pulsed laser deposition, cold ablation is a promising candidate for producing any of the layers. Cold ablation means that the laser pulses used to remove material from a target (which removed material will hit the surface on which the thin film is to be deposited) are so short, in the order of picoseconds or shorter, that there is insufficient time for the energy delivered by the laser pulse to be transferred as heat to the target material. Essentially all energy of the laser pulse will be turned into kinetic energy of the outflying plasma, and the target is not heated considerably—hence the name cold ablation. The plasma that is produced in cold ablation is very homogeneous in the sense that it comprises very few—if any—larger fragments of the target material that could cause pinholes in the layer to be produced.

Advantages of the invention include the possibility of manufacturing radiation windows where the radiation window foil is very thin and yet gastight, and causes very little unwanted absorption or spurious responses in a measurement involving X-rays. Automatic gluing machines are known from the technology of manufacturing electronic components, and such machines can be adapted to perform the attaching of the cut-out pieces of (still carrier-supported) pieced of radiation window foil to their corresponding support structures. Thus the methods illustrated above can be automatized to a relatively high degree, which helps to ensure uniform quality and aesthetically pleasing appearance of the completed products.

I claim:

1. A method for producing a radiation window foil, comprising:
    producing a mesh, said mesh having a first side surface and a second side surface and being supported by a carrier and an etch stop layer on the second side of the mesh, said etch stop layer has a thickness between 10 and 200 nanometers,
    covering the mesh with a layer on the first side of the mesh, said layer spanning the openings in the mesh at a level closer to the second side surface of the mesh than the first side surface of the mesh, a thickness of said layer is less than 1 micrometer, but more than the thickness of the etch stop layer, and
    finally detaching a radiation window foil that comprises the etch stop layer extending over said openings, the mesh and said layer from said carrier.

2. A method according to claim 1, wherein:
    the method comprises, before producing the mesh, producing the etch stop layer on the carrier, and
    the step of detaching the radiation window foil from the carrier comprises etching away the carrier.

3. A method according to claim 1, wherein:
    before covering the mesh with said layer, the method comprises covering the mesh with one or more further layers on the first side of the mesh, said one or more further layers spanning the openings in the mesh at a level closer to the second side surface of the mesh than the first side surface of the mesh, and
    covering the mesh with said layer comprises sandwiching said one or more further layers between said layer and the mesh.

4. A method according to claim 2, wherein:
    before covering the mesh with said layer, the method comprises covering the mesh with one or more further layers on the first side of the mesh, said one or more further layers spanning the openings in the mesh at a level closer to the second side surface of the mesh than the first side surface of the mesh, and
    covering the mesh with said layer comprises sandwiching said one or more further layers between said layer and the mesh.

* * * * *